(12) United States Patent
Kim et al.

(10) Patent No.: US 11,830,855 B2
(45) Date of Patent: Nov. 28, 2023

(54) BACKSIDE INTEGRATED VOLTAGE REGULATOR FOR INTEGRATED CIRCUITS

(71) Applicant: Google LLC, Mountain View, CA (US)

(72) Inventors: Namhoon Kim, San Jose, CA (US); Woon-Seong Kwon, Santa Clara, CA (US); Houle Gan, Santa Clara, CA (US); Yujeong Shim, Cupertino, CA (US); Mikhail Popovich, Danville, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/667,104

(22) Filed: Feb. 8, 2022

(65) Prior Publication Data

US 2022/0157787 A1    May 19, 2022

Related U.S. Application Data

(63) Continuation of application No. 16/788,994, filed on Feb. 12, 2020, now Pat. No. 11,276,668.

(51) Int. Cl.
*H01L 25/065* (2023.01)
*H01L 49/02* (2006.01)

(52) U.S. Cl.
CPC .......... *H01L 25/0657* (2013.01); *H01L 28/10* (2013.01); *H01L 28/40* (2013.01); *H01L 2225/06517* (2013.01); *H01L 2225/06544* (2013.01); *H01L 2225/06548* (2013.01)

(58) Field of Classification Search
CPC ..... H01L 28/40; H01L 25/0657; H01L 28/10; H01L 23/49811; H01L 2225/06517; H01L 25/0537

USPC .......................................... 257/531; 438/597
See application file for complete search history.

(56) References Cited

U.S. PATENT DOCUMENTS

| 6,894,266 B2 | 5/2005 | Richard et al. |
| 10,505,509 B2 | 12/2019 | Lakshmikumar et al. |
| 2003/0162386 A1 | 8/2003 | Ogawa et al. |
| 2006/0113598 A1 | 6/2006 | Chen et al. |
| 2008/0008477 A1 | 1/2008 | Ogawa |

(Continued)

FOREIGN PATENT DOCUMENTS

| CN | 1902751 A | 1/2007 |
| CN | 106980159 A | 7/2017 |

(Continued)

OTHER PUBLICATIONS

Office Action for European Patent Application No. 20195513.5 dated Mar. 16, 2023. 8 pages.

(Continued)

*Primary Examiner* — Thinh T Nguyen
(74) *Attorney, Agent, or Firm* — Lerner David LLP

(57) ABSTRACT

The technology relates to an integrated circuit (IC) package. The IC package may include a packaging substrate, an IC die, and an integrated voltage regulator die. The IC die may include a metal layer and a silicon layer. The metal layer may be connected to the packaging substrate. The integrated voltage regulator die may be positioned adjacent to the silicon layer and connected to the packaging substrate via one or more through mold vias or through dielectric vias. The IC die may be an application specific integrated circuit (ASIC) die.

10 Claims, 8 Drawing Sheets

(56) References Cited

U.S. PATENT DOCUMENTS

| | | |
|---|---|---|
| 2009/0226130 A1 | 9/2009 | Doany et al. |
| 2010/0006784 A1 | 1/2010 | Mack et al. |
| 2011/0206316 A1 | 8/2011 | Wang et al. |
| 2012/0012990 A1 | 1/2012 | Pagaila et al. |
| 2012/0032340 A1 | 2/2012 | Choi et al. |
| 2012/0061814 A1 | 3/2012 | Camacho et al. |
| 2014/0321804 A1 | 10/2014 | Thacker et al. |
| 2015/0187608 A1 | 7/2015 | Ganesan et al. |
| 2016/0190113 A1 | 6/2016 | Sharan et al. |
| 2016/0314091 A1 | 10/2016 | Dutt et al. |
| 2018/0052281 A1 | 2/2018 | Kuo et al. |
| 2018/0196196 A1 | 7/2018 | Byrd et al. |
| 2018/0299628 A1 | 10/2018 | Liu et al. |
| 2019/0044002 A1 | 2/2019 | Byrd et al. |
| 2019/0057940 A1 | 2/2019 | Cheah et al. |
| 2019/0086618 A1 | 3/2019 | Shastri et al. |
| 2019/0319160 A1 | 10/2019 | Riviere |
| 2019/0335252 A1 | 10/2019 | Ryan |
| 2019/0371781 A1 | 12/2019 | Huang et al. |
| 2020/0037055 A1 | 1/2020 | Kucharewski et al. |
| 2020/0132930 A1 | 4/2020 | Bchir |
| 2020/0132946 A1 | 4/2020 | Bchir |
| 2020/0204399 A1 | 6/2020 | Crayford et al. |
| 2020/0273783 A1* | 8/2020 | Sankman et al. ............... H01L 23/49811 |
| 2020/0286871 A1 | 9/2020 | Liff et al. |

FOREIGN PATENT DOCUMENTS

| | | |
|---|---|---|
| CN | 107768303 A | 3/2018 |
| CN | 108735687 A | 11/2018 |
| CN | 109216315 A | 1/2019 |
| TW | 201519379 A | 5/2015 |
| TW | 201903449 A | 1/2019 |
| WO | 2017160284 A1 | 9/2017 |
| WO | 2018172484 A1 | 9/2018 |
| WO | 2019050477 A1 | 3/2019 |
| WO | 2019133019 A1 | 7/2019 |

OTHER PUBLICATIONS

Office Action for Chinese Patent Application No. 202010817738.2 dated Mar. 10, 2022. 5 pages.

Office Action for Taiwanese Patent Application No. 109135652 dated Dec. 8, 2022. 8 pages.

Notice of Allowance with Search Report for Taiwanese Patent Application No. 111122711 dated Jul. 27, 2022. 5 pages.

Rockley Photonics Demonstrates In-Package Optics Platform to Select Partners, Aug. 15, 2019, six pages.

Light On Board Optical IC Package, Reflex Photonics, Aug. 15, 2019, two pages.

Office Action for Taiwanese Patent Application No. 109125385 dated Dec. 31, 2020. 5 pages.

Extended European Search Report for European Patent Application No. 20195513.5 dated Feb. 2, 2021. 10 pages.

Extended European Search Report for European Patent Application No. 20205957.2 dated May 10, 2021. 7 pages.

Liu. AVR Single Chip Microcomputer Principles and Measurement and Control Engineering Applications: Based on ATmega48/ATmega16. Jun. 30, 2015. Beihang University Press. 4 pages.

Li. Automotive Electrical and Electronic Technology. Sep. 30, 2016. Jiangsu Phoenix Science Press. 6 pages.

Notification of the First Office Action for Chinese Patent Application No. 202010817738.2 dated Aug. 3, 2021. 8 pages.

Office Action for Taiwanese Patent Application No. 109125385 dated Aug. 30, 2021. 5 pages.

Office Action for Chinese Patent Application No. 202011056882.5 dated Sep. 5, 2023. 6 pages.

Office Action for European Patent Application No. 20205957.2 dated Jul. 27, 2023. 5 pages.

* cited by examiner

US 11,830,855 B2

BACKSIDE INTEGRATED VOLTAGE REGULATOR FOR INTEGRATED CIRCUITS

CROSS-REFERENCE TO RELATED APPLICATION

The present application is a continuation of U.S. patent application Ser. No. 16/788,994, filed Feb. 12, 2020, the disclosure of which is hereby incorporated herein by reference.

BACKGROUND

Application specific integrated circuit (ASIC) packages which include one or more ASIC dies are becoming increasingly capable of processing at high speeds. As the processing speed of the ASIC dies continue to increase, the power consumed by the ASIC dies may also increase. The increase in power consumption by the ASIC dies may lead to an increase of heat within the ASIC package, which may cause components in the ASIC package to fail or reduce the performance of the ASIC package.

SUMMARY

One aspect of the disclosure provides an integrated circuit (IC) package. The IC package may include a packaging substrate, an IC die and an integrated voltage regulator die. The IC die may include a metal layer and a silicon layer. The metal layer may be connected to the packaging substrate. The integrated voltage regulator die may be positioned adjacent to the silicon layer and connected to the packaging substrate via one or more through mold vias (TMVs) or through dielectric vias (TDVs).

In some instances, the integrated voltage regulator die is connected to the silicone layer by a power distribution network (PDN). In some examples, the PDN includes one or more through silicon vias (TSVs) within the silicon layer. In some examples, the PDN further includes a redistribution layer configured to provide power from the integrated voltage regulator die to the TSVs. In some examples, the TSVs and redistribution layer form an inductor.

In some instances, each of the one or more TMVs are connected to the packaging substrate on a first end by a flip chip bump and to the integrated voltage regulator die at a second opposite end.

In some instances, the silicon layer is connected to the packaging substrate via one or more flip chip bumps.

In some instances, the packaging substrate is configured to connect to a land grid array (LGA) socket or ball grid array (BGA) socket. In some examples, power is delivered to the integrated voltage regulator die via the LGA socket or the BGA socket. In some examples, the packaging substrate includes a redistribution layer configured to route the power from the LGA socket or the BGA socket to the one or more TMVs.

Another aspect of the technology is directed to an integrated circuit (IC) package including a packaging substrate, an application specific integrated circuit (ASIC) die, and an integrated voltage regulator die. The ASIC die may include a metal layer and a silicon layer, the metal layer being connected to the packaging substrate. The integrated voltage regulator die may be positioned adjacent to the silicon layer and connected to the packaging substrate via one or more through mold vias (TMVs) or through dielectric vias (TDVs), the integrated voltage regulator die configured to provide power to the ASIC die.

In some instances, the integrated voltage regulator die is connected to the silicone layer by a power distribution network (PDN). In some examples, the PDN includes one or more through silicon vias (TSVs) within the silicon layer, and the integrated voltage regulator die is configured to provide power to the ASIC die via the TSVs. In some examples, the PDN further includes a redistribution layer configured to provide power from the integrated voltage regulator die to the TSVs. In some examples, the TSVs and redistribution layer form an inductor.

In some instances, each of the one or more TMVs are connected to the packaging substrate on a first end by a flip chip bump and to the integrated voltage regulator die at a second opposite end.

In some instances, the silicon layer is connected to the packaging substrate via one or more flip chip bumps.

In some instances, the packaging substrate is configured to connect to a land grid array (LGA) socket or ball grid array (BGA) socket. In some examples, power is delivered to the integrated voltage regulator die via the LGA socket or the BGA socket. In some examples, the packaging substrate includes a redistribution layer configured to route the power from the LGA socket or the BGA socket to the one or more TMVs.

In some instances, the IC package further includes deep trench capacitors embedded into the silicon layer or stacked on the silicon layer for use by the integrated voltage regulator die.

DETAILED DESCRIPTION

Figure 1:
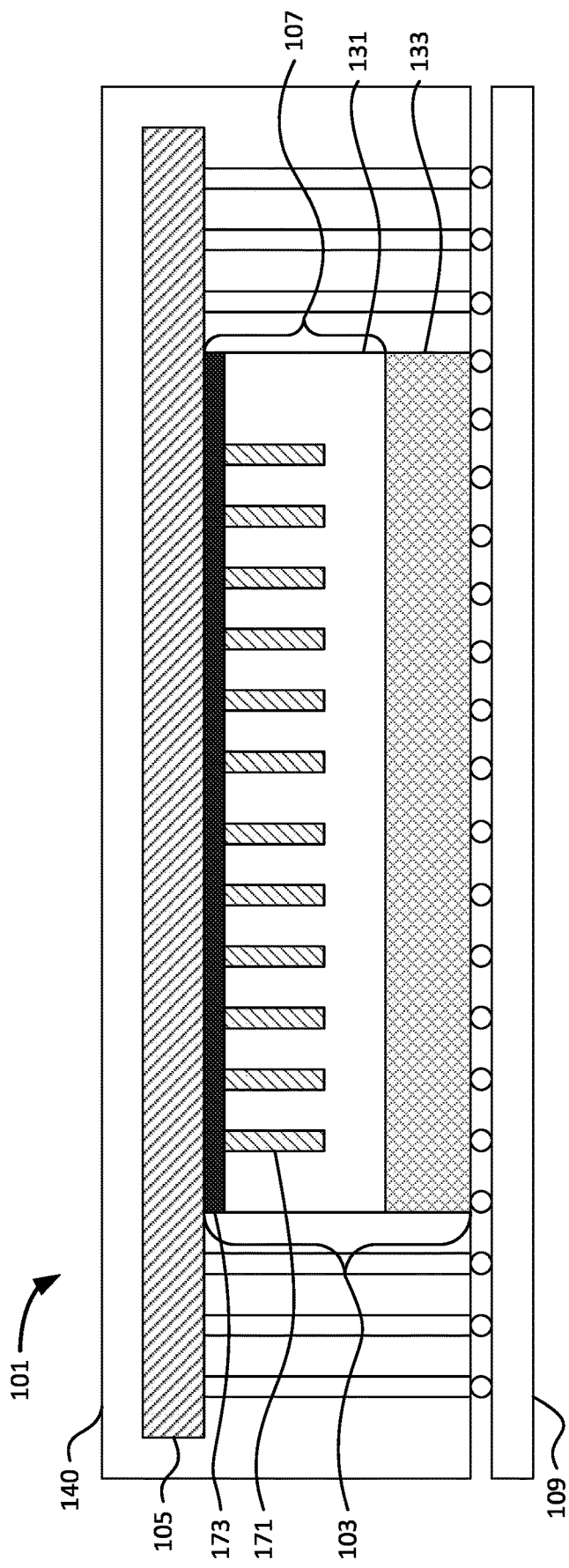
FIG. 1 is a side cut-away view of an ASIC package with an integrated voltage regulator die in accordance with aspects of the disclosure.

The technology relates generally to integrating a voltage regulator die onto the backside of an application specific integrated circuit (ASIC) package. For example, and as shown in FIG. 1, the ASIC package 101 includes an ASIC die 103 including a silicon substrate 131 and one or more metal layers 133. The ASIC die 103 may be positioned such that the metal layer is adjacent to a packaging substrate 109.

An integrated voltage regulator die 105 may be mounted to the backside of the ASIC die 103, adjacent to the silicon substrate 131. Power may be delivered to the ASIC die 103 by the integrated voltage regulator die 105 using a backside power distribution network PDN 107 including through-silicon vias (TSVs) 171 and a redistribution layer 173. The ASIC package 201 may include a housing, such as housing 140 in which at least some of the components of the ASIC package 101 may be positioned.

As previously described, increases in processing speed of an ASIC die may increase the amount of power required to operate the ASIC die. An increase in power drawn by an ASIC die within a typical ASIC package may result in an increase of heat within the ASIC package due to copper losses generated by the wires and/or other such connections which carry the power through the ASIC package. Copper losses, also known as "I²R losses", where 'I' is the current flowing through the copper wiring and 'R' is the resistance of the wiring, is the amount of heat dissipated as current passes through wiring. The increase in temperature generated by the increased power draw of the ASIC die may result in solder electromigration and potential failure of solder joints. The increase of temperature may also affect the thermal performance of the ASIC die and other components within the ASIC package, potentially leading to failure of the ASIC die, failure of other components of the ASIC package, or reduced processing performance.

Figure 2B:
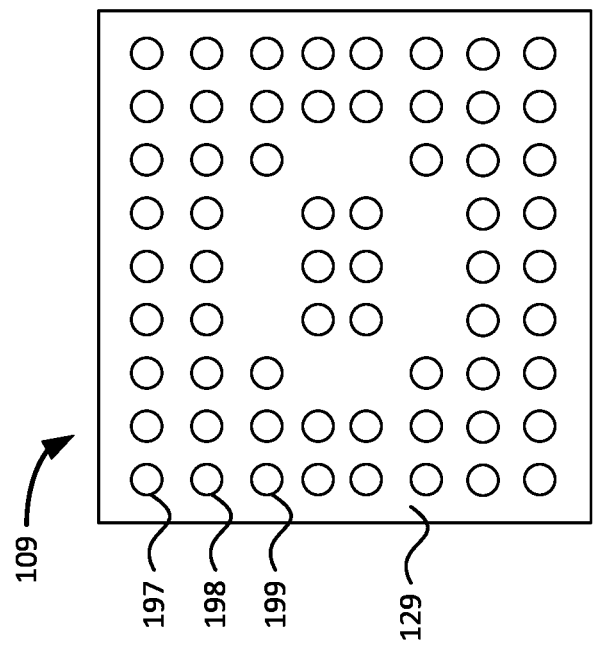
FIG. 2B is a view of the bottom of a packaging substrate in accordance with aspects of the disclosure.
Figure 2A:
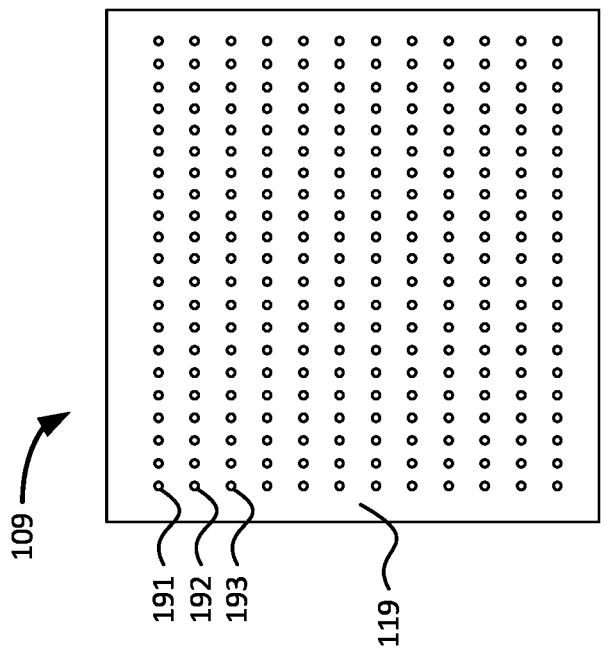
FIG. 2A is a top-down view of a package substrate in accordance with aspects of the disclosure.

To reduce or remediate the amount of copper losses generated by wires, planes, such as copper planes, redistribution layers, and/or other such connections which carry the power through the ASIC package to the ASIC die, a voltage regulator may be integrated into the ASIC package The packaging substrate 109 may be configured to connect the ASIC package 101 to a circuit board or other such chip carrier. In this regard, the packaging substrate 109 may have arrays of connectors on its top side and bottom side, as shown in FIGS. 2A and 2B, respectively. In some instances, connectors may be included on the sides of the packaging substrate 109. Referring to FIG. 1, although the packaging substrate 109 is shown as being outside of housing 140, the packaging substrate 109 may be positioned fully or partially within the housing 140.

Referring to FIG. 2A, a top side 119 of the packaging substrate 109 shows a plurality of connectors, including connectors 191-193. For clarity, only a portion of the connectors on the top side 119 of the packaging substrate 109 are labeled. The connectors, including connectors 191-193, may be connector pads onto which other components of the ASIC package 101 may be connected, as described herein. The connector pads may be gold, nickel, tin, copper, solder, or other such conductive materials.

The top side 119 of the packaging substrate 109 may include any number of connector pads arranged in any layout. In this regard, the arrangement and number of connectors, including connector pads 191-193, shown in FIG. 2A is merely for illustration. For instance, the number and arrangement of connector pads on the top side of the packaging substrate may be based on the design and arrangement of the ASIC die 103, integrated voltage regulator die 105, and/or other components within the ASIC package 101 to allow for the ASIC package to attach to the top side of the packaging substrate 119.

FIG. 2B shows a bottom side 129 of the packaging substrate including a plurality of connectors, including connectors 197-199. For clarity, only a portion of the connectors on the bottom side 129 are labeled. The connectors, including connectors 197-199, may be configured to connect or otherwise mount the ASIC package 101 to a printed circuit board (PCB), socket, or other such chip carrier. The connectors may be solder balls, pins, sockets, etc. The connectors 197-199 may be gold, nickel, tin, copper, solder, or other such conductive material.

The bottom side 129 of the packaging substrate may include any number of connectors in any arrangement. In this regard, the arrangement and number of connectors, including connectors 197-199, shown in FIG. 2B is merely for illustration. For instance, the connectors on the bottom side 129 of the packaging substrate may be solder balls arranged in a ball grid array (BGA). Other such arrangements and connectors may include contacts arranged in a land grid array (LGA), connector pins arranged in a pin grid array (PGA), etc.

Figure 3A:
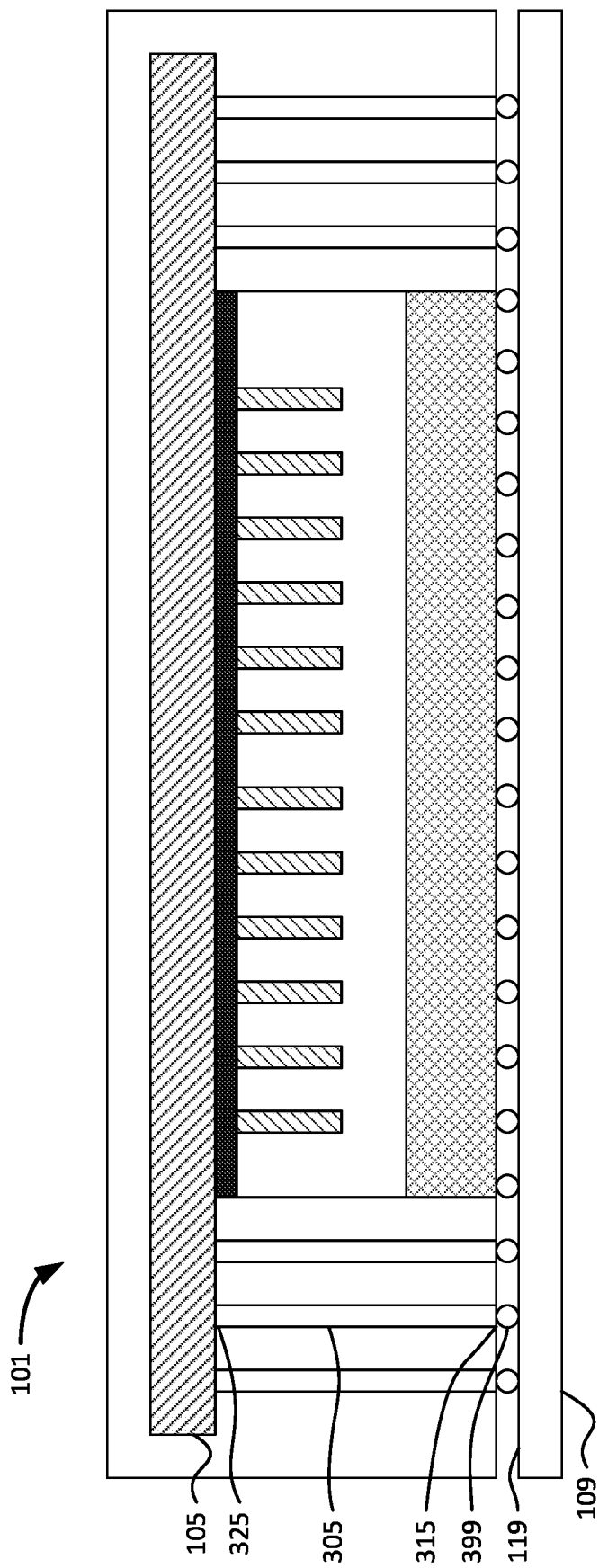
FIG. 3A is a side cut-away view of an ASIC package with an integrated voltage regulator die in accordance with aspects of the disclosure.

The integrated voltage regulator die 105 may be connected to one or more connector pads on the top side 119 packaging substrate 109. For instance, the connection between the voltage regulator die 105 and the packaging substrate 109 may be made via one or more through mold vias (TMVs), such as TMV 305, as shown in FIG. 3A. For clarity, only a portion of the TMVs shown in FIG. 3A are labeled.

Each TMV may connect the integrated voltage regulator die 105 to the packaging substrate 109 via a connector pad or other such connector. For instance, the first end 315 of TMV 305 may be attached to a connector pad 399 and the opposite end 325 of the TMV 305 may be attached to the integrated voltage regulator die 105.

Figure 3B:
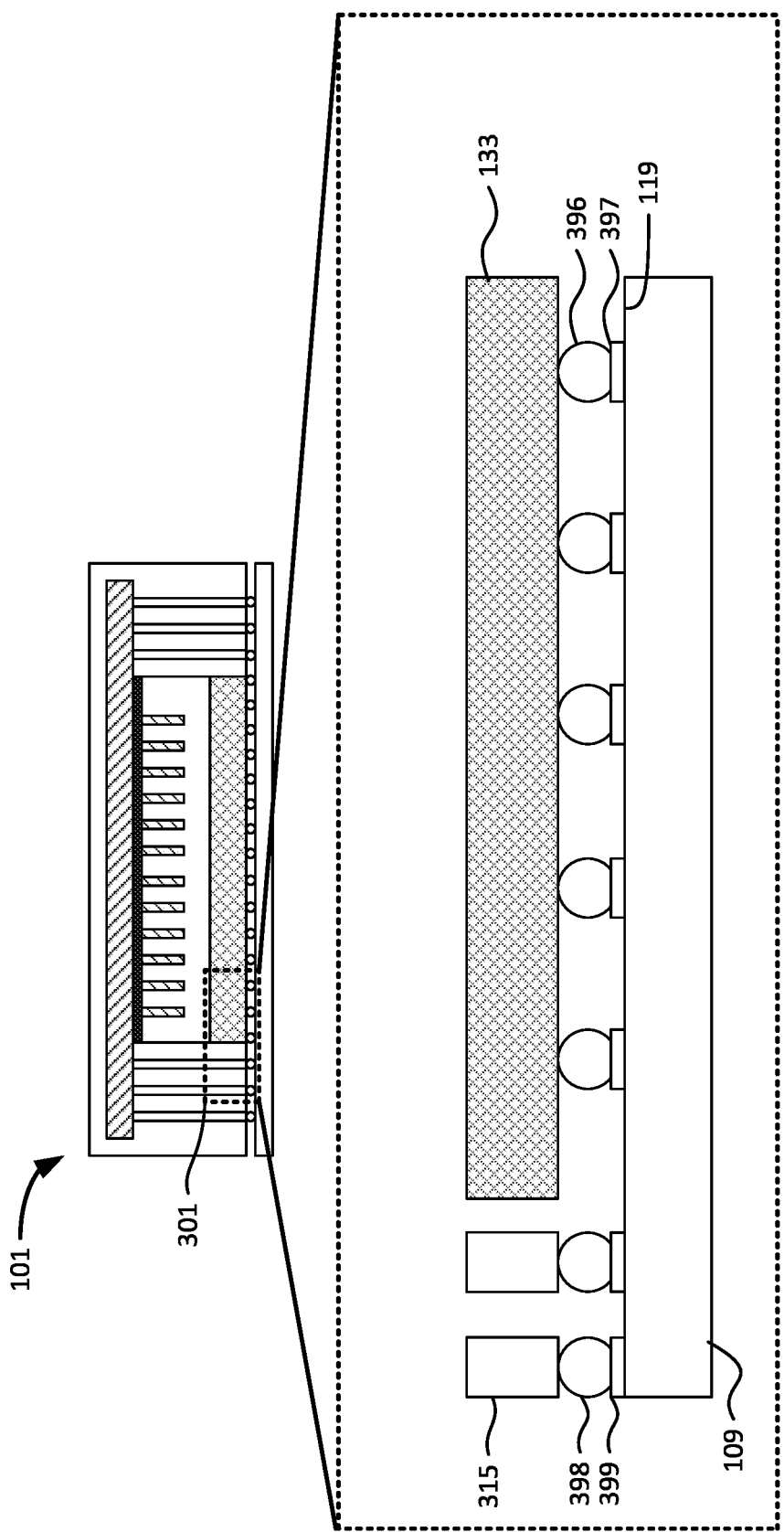
FIG. 3B is an exploded, side cut-away view of a portion of an ASIC package in accordance with aspects of the disclosure.

The connection between the TMVs and the connector pads may be made via a soldered flip chip bump. For example, FIG. 3B shows an exploded side-view of a portion 301 of the ASIC package 101, including the connection between TMV 305 and connector pad 399. The first end 315 of the TMV 305 is connected to connector pad 399 on the top side 119 of the packaging substrate 109 via a soldered flip chip bump 398. Although the TMVs are shown as being connected via soldered flip chip bumps in FIG. 3B, other connectors and connections may be used.

The metal layer 133 of the ASIC die 103 may also be connected to the packaging substrate 109. The connection of the metal layer 133 to the packaging substrate 109 may be made via flip chip bumps and connector pads, or other such connectors. For example, and as further shown in FIG. 3B, flip chip bump 396 connects the metal layer 133 to connector pad 397, on the top side 119 of the packaging substrate. Although the flip chip bumps are shown in FIG. 3B as being soldered onto connector pads, such as flip chip bump 396 being soldered onto connector pad 397, other connections may be used.

Figure 4A:
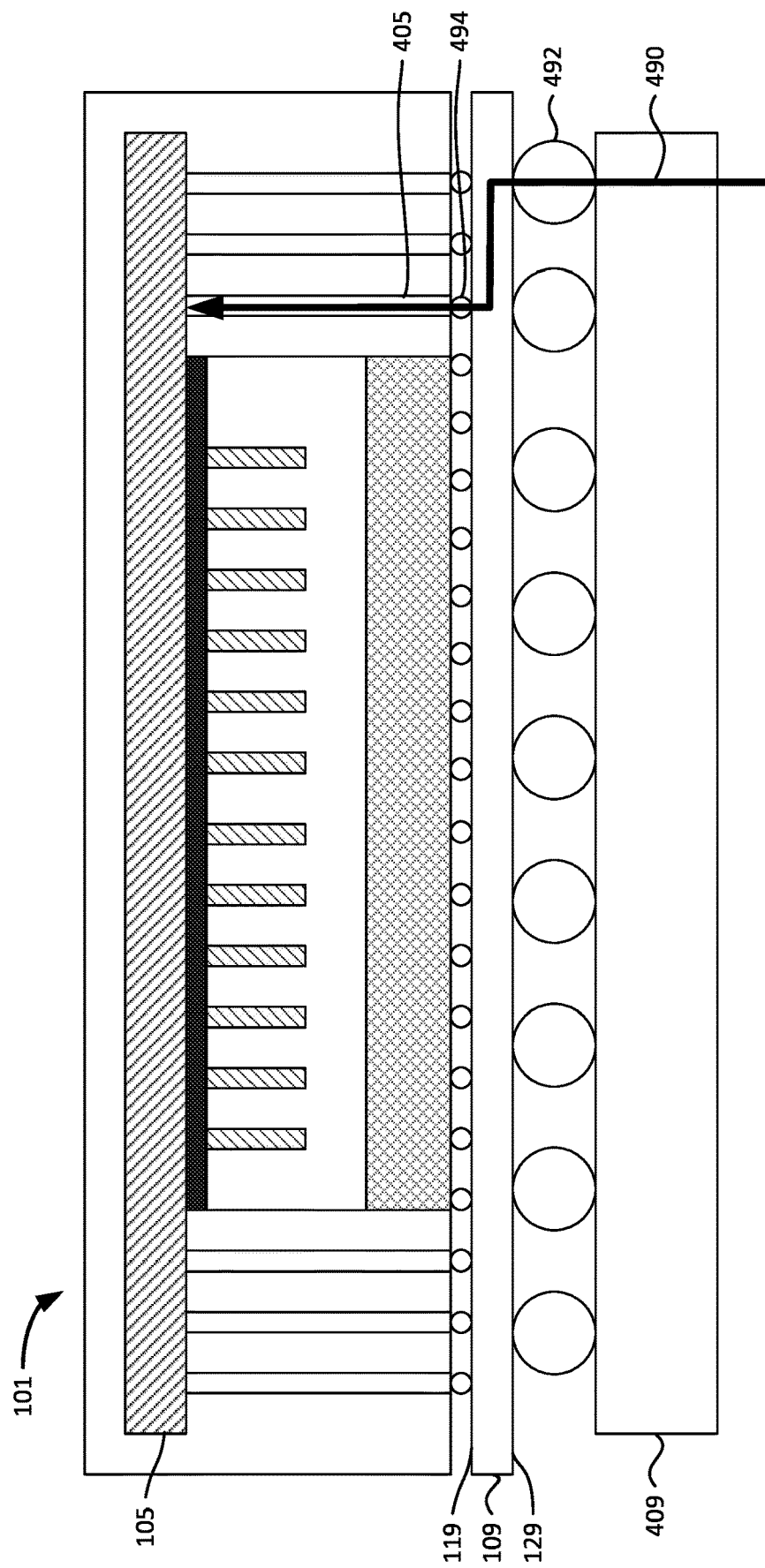
FIG. 4A is a side cut-away view of an ASIC package showing power delivery to an integrated voltage regulator die in accordance with aspects of the disclosure.

Power may be supplied to the ASIC package 101 by an external power source. In this regard, the external power source may provide power to the ASIC package 101 through the chip carrier to which the ASIC package 101 is mounted. For example, and as illustrated in FIG. 4A, power, shown as arrow 490, may be supplied from an external power source (not shown) to the PCB 409. PCB 409 may supply the power to a connector on the packaging substrate.

The packaging substrate may include a redistribution layer etched onto, or otherwise embedded within, that routes power between the connectors on the bottom side 129 of the packaging substrate and connector pads 119 on the top side of the packaging substrate 109. For instance, power 490 delivered by the PCB, or other such chip mount, at connector 492 on the bottom side 129 of the packaging substrate 109 may be routed by the redistribution layer to connector pad 494 on the top side 119 of the packaging substrate. Although FIG. 4A illustrates the power 490 being supplied to connector 492 and routed to connector pad 494, power may be supplied to any of the connectors on the bottom side of the packaging substrate 109, and in some instances, to more than one connectors. The power may be routed by the redistribution layer from the one or more connectors to one or more of the connector pads. For instance, power may be routed from one or more of the connectors on the bottom side 129 of the packaging substrate 109 to one, two, three, or more connector pads on the top side 119 of the packaging substrate 109.

Power may be carried from the packaging substrate 109 to the integrated voltage regulator die 105 by one or more TMVs. For example, FIG. 4A shows power 490 being routed by TMV 405 from connector pad 494 to the integrated voltage regulator die 105. For clarity, power is shown being routed through only TMV 405. In some instances, power may be routed to the integrated voltage regulator die 105 by more than one TMV.

Power received by the integrated voltage regulator die may be considered the input power supply. The input power supply may be delivered to the integrated voltage regulator die 105 at a higher voltage level and lower current level than the input power supply delivered directly to the ASIC die. The integrated voltage regulator die 105 may provide power to the ASIC die 103 with a different supply voltage level. For example, the integrated voltage regulator die 105 may operate as a switching voltage regulator and adjust the amount of voltage supplied to the ASIC die based on the needs of the ASIC die or other components within the ASIC package 101.

Figure 4B:
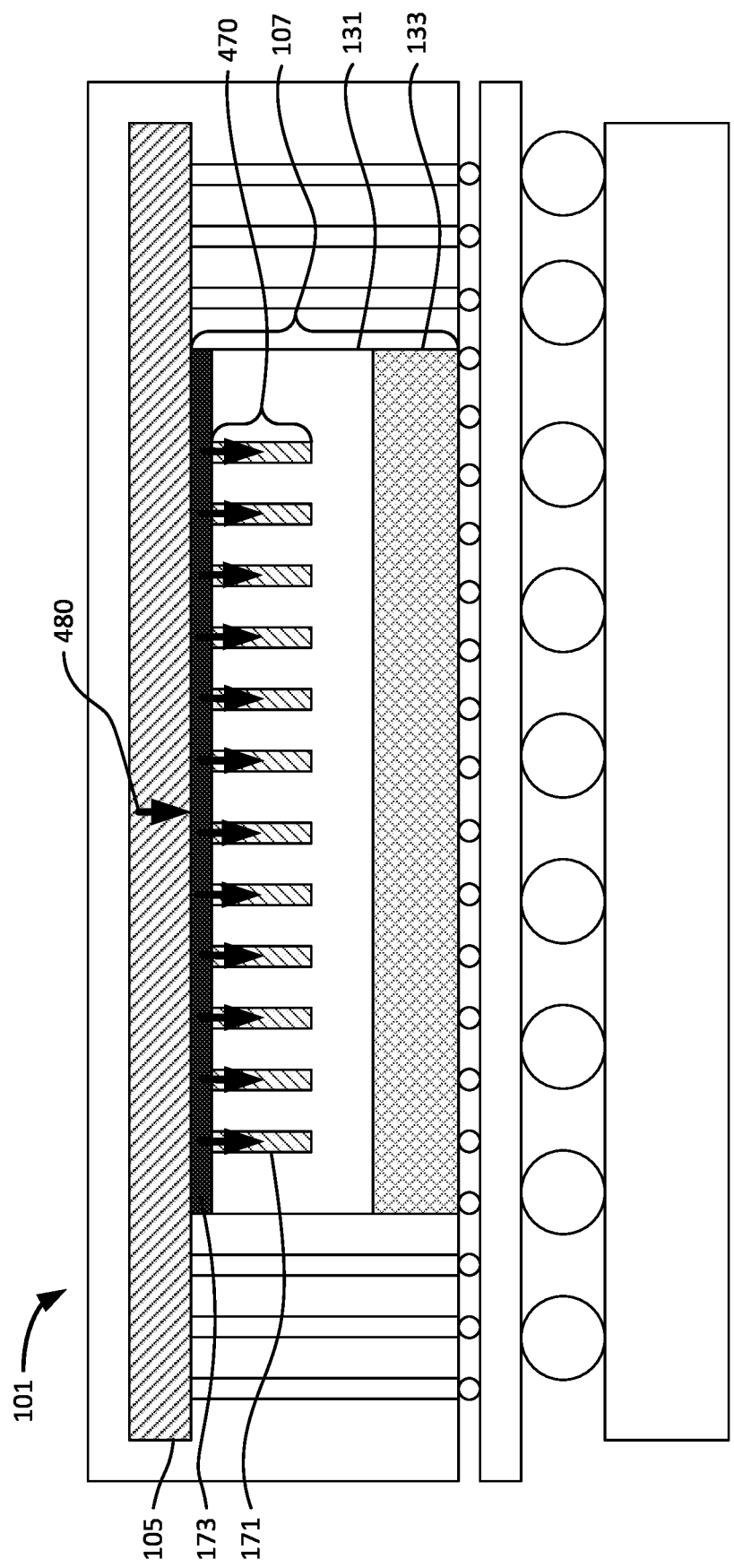
FIG. 4B is a side cut-away view of an ASIC package showing power delivery to an ASIC die from an integrated voltage regulator die in accordance with aspects of the disclosure.

The integrated voltage regulator die 105 may deliver power to the ASIC die 107 via backside TSVs. For example, and as shown in FIG. 4B, power, illustrated by arrow 480 may be provided from the integrated voltage regulator die 105 to a backside redistribution layer 173. The redistribution layer 173 may direct power to one or more TSV 470, including TSV 171, embedded within the silicon layer 131 of the ASIC die 107. Although FIG. 4B illustrates power being delivered to all of the TSVs 470, power may be delivered to any number of TSVs.

Referring to FIG. 4B, the backside redistribution layer 173 may be etched into and/or positioned above the silicon layer 131. The backside redistribution layer 173 together with the TSVs may be used to create inductors for use by the integrated voltage regulator die 105. Deep trench capacitors (DTCs) may also be embedded into the silicon layer 131 of the ASIC die 107 for use by the integrated voltage regulator die 105. In this regard, switching voltage regulators typically require many inductors and capacitors to operate. In instances where the integrated voltage regulator die 105 is a switching voltage regulator, the backside redistribution layer 173, the TSVs 470, as well as the DTC's embedded silicon (not shown) may provide at least some the functionality of inductors and capacitors. In some instances, the inductors and DTCs may be stacked onto the ASIC die.

As discussed herein, increases in processing speed of an ASIC die may increase the amount of power required to operate the ASIC die. An increase in power drawn by an ASIC die within an ASIC package without an integrated voltage regulator die may result in an increase of heat within the ASIC package due to copper losses generated by the wires and/or other such connections which carry the power through the ASIC package. By integrating the integrated voltage regulator die in the ASIC package, such as integrated voltage regulator die 105 in ASIC package 101, the power drawn by the ASIC package from an external power source may be limited, controlled, or otherwise regulated. For example, the integrated voltage regulator die 105 may cap the amount of power drawn by the components within ASIC package 101, such as ASIC die 107. In some examples, the integrated voltage regulator die 105 may include a closed loop feedback system to provide a steady voltage output.

In another example, the integrated voltage regulator die 105 may throttle the amount of power drawn, such as when the temperature of the ASIC die 107 is above a particular value or the ASIC die 107 does not require full power to operate. The integrated voltage regulator die 105 may also accept higher input voltages, thereby reducing the current supplied to the ASIC package 101 by an external power supply. Accordingly, the amount of current carried by the wires, traces, and/or other such connections on or within the ASIC package may be reduced, resulting in a decrease in the amount of copper losses and minimizing electromigration failure risk in the ASIC package. Moreover, the integrated voltage regulator die 105 may reduce overall power consumption and increase power efficiency of the ASIC package 101.

The voltage regulator may maintain a consistent power draw from the external power source, thereby preventing or reducing the number of increases in power carried by the wires, traces, and/or other such connections on or within the ASIC package 101. In some instances, the integrated voltage regulator die 105 can include a closed loop feedback system to minimize voltage fluctuations output. In this regard, a feedback sense line may monitor the voltage output by the integrated voltage regulator die 105 and feed monitored voltage level back to the integrated voltage regulator die 105. The feedback sense line may have high bandwidth, so the integrated voltage regulator die 105 may be able to compensate for voltage fluctuations quickly. By doing such, inductive noise caused by voltage fluctuations may be reduced.

Figure 5:
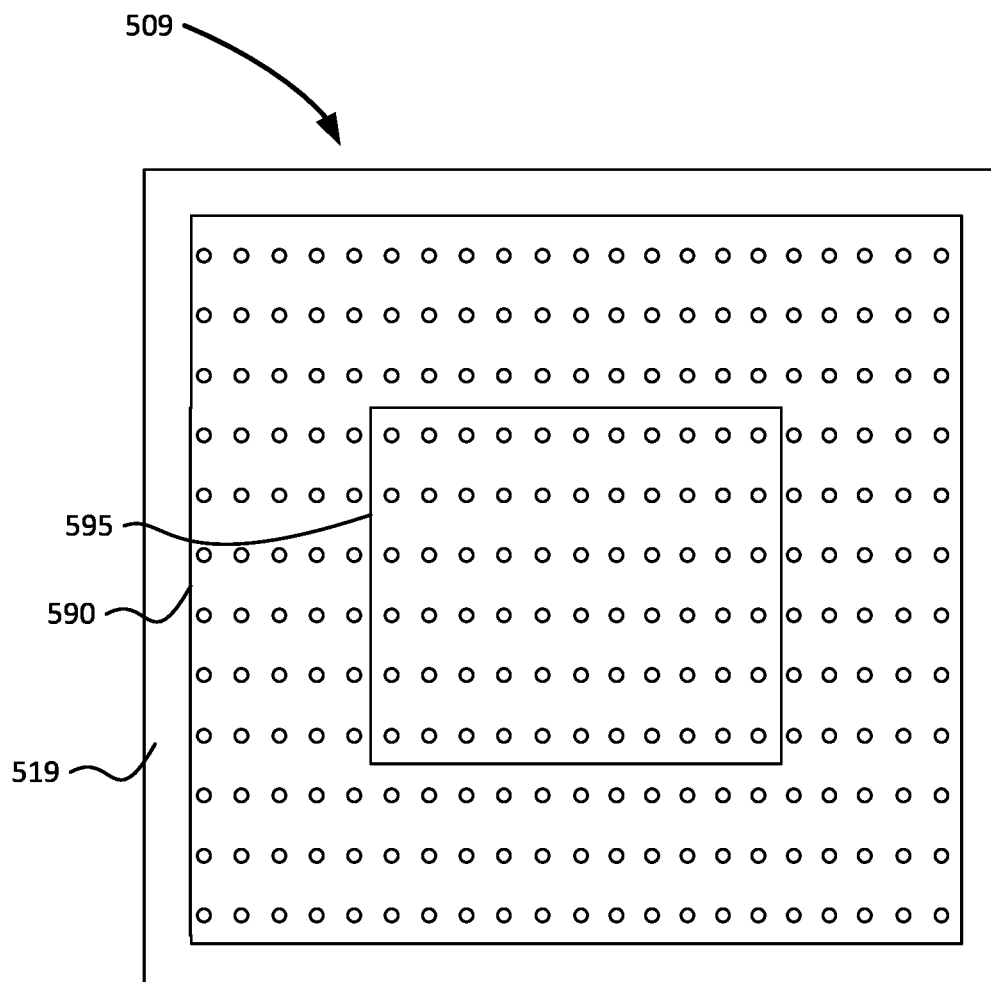
FIG. 5 is a top-down view of a packaging substrate with interior and exterior connectors in accordance with aspects of the disclosure.

A typical ASIC die will receive power from connectors on a packaging substrate which are closer to the ASIC die to reduce the amount of heat generated by power delivery. Consequently, data signals may be required to traverse longer paths from the ASIC die to connectors positioned on the exterior of the packaging substrate, thereby slowing the processing speed of the ASIC package. FIG. 5 illustrates an interior and exterior collection of connectors, 595 and 590, respectively, on the top side 519 of a packaging substrate 509. In a typical ASIC package, power may be delivered by the connectors within the interior 595 of the packaging substrate 509 and data may be delivered by the connections within the exterior 590 of the packaging substrate 509.

Figure 6:
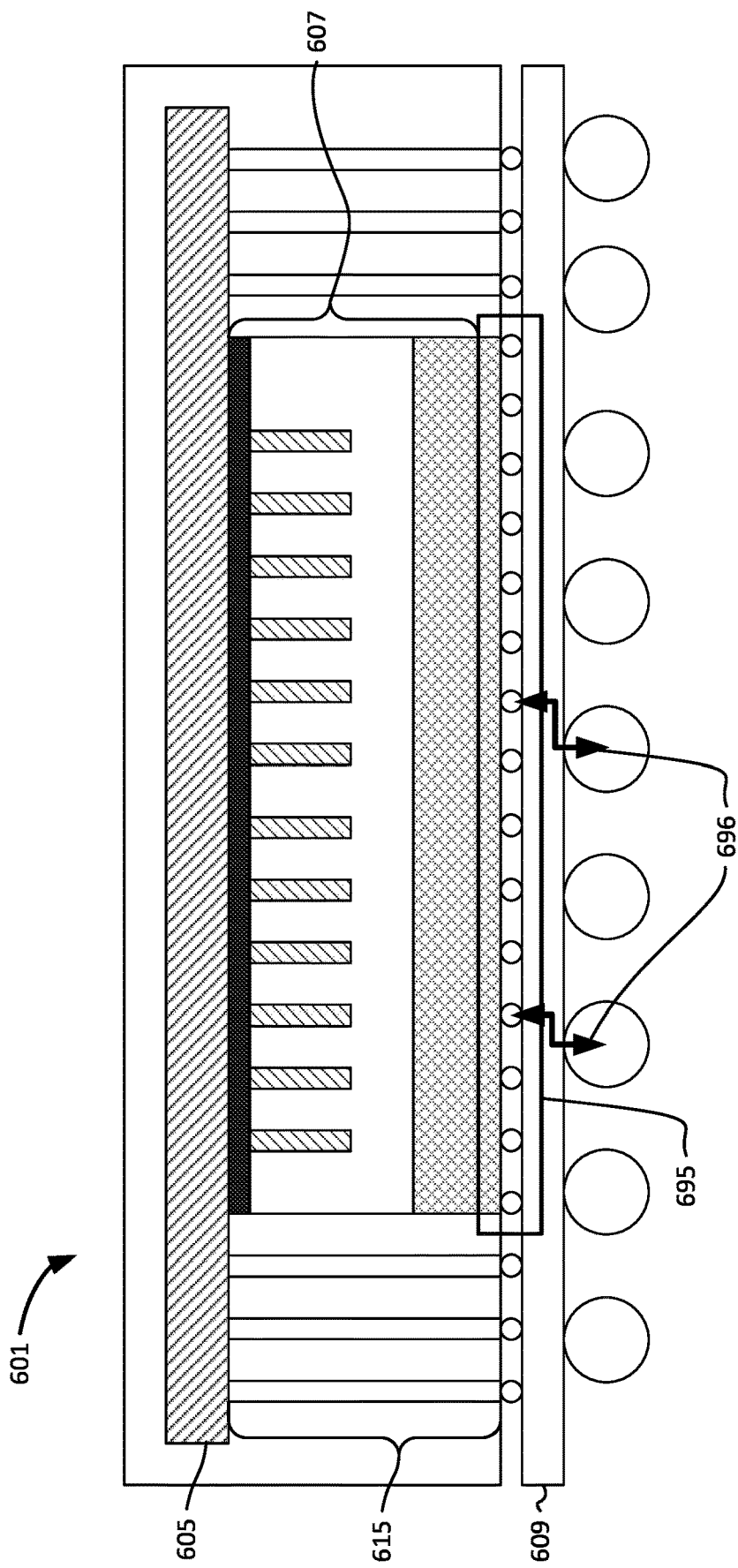
FIG. 6 is a side cut-away view of an ASIC package showing data communication in accordance with aspects of the disclosure.

Referring to FIG. 6, by positioning the integrated voltage regulator die 605 above the ASIC die 607 and connecting the integrated voltage regulator die 505 to the packaging substrate through TMVs 615 positioned around the exterior of the ASIC die 607, the data connections between the ASIC die 607 and the packaging substrate 609 may be moved to the interior collection of connectors 695. Accordingly, the distance data needs to travel from the ASIC die 607 to the packaging substrate 609 may be reduced, as illustrated by arrows 696, resulting in improved communication speeds and reduced signal loss. The data connections may be routed by the redistribution layer in the packaging substrate and may include SERDES connections, parallel connections, serial connections, etc.

Although the example ASIC packages 101 and 601 described herein are described with reference to a single ASIC die 105, 605, respectively, each ASIC package may include any number of ASIC dies. Moreover, each ASIC package may include any number of voltage regulators or other components. Additionally, although the packages described herein are described as ASIC packages having ASIC dies, any type of die may be used, such as a memory die or integrated circuit die.

The features described herein allow for the integration of an integrated voltage regulator die into the ASIC package. By doing such, the copper losses generated by wires, traces, and/or other such connections which carry the power through the ASIC package to the ASIC die may be reduced. Moreover, by positioning the integrated voltage regulator die above the ASIC die, the distance data communications travel between the ASIC die and the PCB may be reduced.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology as defined by the appended claims.

The invention claimed is:

1. An integrated circuit (IC) package comprising:
   an IC die including a silicon layer; and
   an integrated voltage regulator die configured to provide power to the IC die, the integrated voltage regulator being positioned adjacent to the silicon layer and connected to the silicon layer via an intervening power distribution network (PDN).

2. The IC package of claim 1, wherein the IC package further includes a packaging substrate, wherein the integrated voltage regulator die is connected to the packaging substrate via one or more through mold vias (TMVs) or one or more dielectric vias (TDVs), wherein the integrated voltage regulator die is configured to receive power through the one or more TMVs or TDVs.

3. The IC package of claim 2, wherein the PDN includes one or more through silicon vias (TSVs) within the silicon layer.

4. The IC package of claim 3, wherein the PDN further includes a redistribution layer configured to provide power from the integrated voltage regulator die to the TSVs.

5. The IC package of claim 4, wherein the TSVs and redistribution layer form an inductor.

6. The IC package of claim 2, wherein each of the one or more TMVs or TDVs are connected to the packaging substrate on a first end by a flip chip bump and to the integrated voltage regulator die at a second opposite end.

7. The IC package of claim 1, wherein the IC package further includes a packaging substrate, and wherein the silicon layer is connected to the packaging substrate via one or more flip chip bumps.

8. The IC package of claim 1, wherein the IC package further includes a packaging substrate, and wherein the packaging substrate is configured to connect to a land grid array (LGA) socket or ball grid array (BGA) socket.

9. The IC package of claim 8, wherein power is delivered to the integrated voltage regulator die via the LGA socket or the BGA socket.

10. The IC package of claim 9,
   wherein the integrated voltage regulator die is connected to the packaging substrate via one or more through mold vias (TMVs), and
   wherein the packaging substrate includes a redistribution layer configured to route the power from the LGA socket or the BGA socket to the one or more TMVs.

* * * * *